United States Patent [19]
Llewellyn

[11] Patent Number: 5,329,251
[45] Date of Patent: Jul. 12, 1994

[54] MULTIPLE BIASING PHASE-LOCK-LOOPS CONTROLLING CENTER FREQUENCY OF PHASE-LOCK-LOOP CLOCK RECOVERY CIRCUIT

[75] Inventor: William D. Llewellyn, San Jose, Calif.

[73] Assignee: National Semiconductor Corporation, Santa Clara, Calif.

[21] Appl. No.: 55,137

[22] Filed: Apr. 28, 1993

[51] Int. Cl.$^5$ ............................................. H03L 7/07
[52] U.S. Cl. .................................... 331/2; 331/16; 331/17; 360/51
[58] Field of Search ................... 331/1 A, 2, 16, 17, 331/18, 25; 360/51

[56] References Cited

U.S. PATENT DOCUMENTS

| | | | |
|---|---|---|---|
| 4,980,652 | 12/1990 | Tarusawa et al. | 331/16 X |
| 5,043,677 | 8/1991 | Tomassetti et al. | 331/2 |
| 5,072,195 | 12/1991 | Graham et al. | 331/2 |
| 5,075,639 | 12/1991 | Taya | 331/2 |

OTHER PUBLICATIONS

Goodenough, Frank, "DSP Technique Nearly Doubles Disk Capacity", Electronic Design, Feb. 4, 1993, pp. 53–58.
Llewellyn, William D., et al., *A 33Mh/s Data Synchronizing Phase-Locked Loop Circuit (WAM1.1)*, presented at Session 1: High Speed Data Recovery, 1988 IEEE International Solid State Circuits Conference, Feb. 17, 1988, pp. 12, 13, 276, 277.
Gomez, Ray et al., *An Analog Discrete-Time Processor for Magnetic Recording Channels*, undated, from Integrated Circuits and Systems Laboratory, University of California, Los Angeles (4 pages) (no date).

*Primary Examiner*—David Mis
*Attorney, Agent, or Firm*—Limbach & Limbach

[57] ABSTRACT

A recovered clock signal is phase aligned with timing data that has been extracted by a digital signal processor (DSP) from an input signal by a multiple phase-lock-loop (PLL) clock recovery circuit that utilizes a digital error word generated by the DSP. The multiple PLL clock recovery circuit uses a first PLL and a second PLL to generate a first biasing signal and a second biasing signal, respectively, which have a magnitude which is a function of the frequency of a first clock signal and a second clock signal, respectively. A multiplexor allows either the first biasing signal or the second biasing signal to be selected as a selected bias signal. A controlled oscillator generates the recovered clock signal with a center frequency which is a function of the magnitude of a phase error signal. A digital-to-analog converter (DAC) generates the phase error signal by modifying the selected bias signal in response to the digital error word. The first biasing signal and the second biasing signal can be switched in and out of the DAC to quickly bias the DAC to drive the controlled oscillator to a specific center frequency.

23 Claims, 4 Drawing Sheets

MULTIPLE BIASING PHASE-LOCK-LOOPS CONTROLLING CENTER FREQUENCY OF PHASE-LOCK-LOOP CLOCK RECOVERY CIRCUIT

BACKGROUND OF THE INVENTION

1. Field of the Invention

The present invention relates to phase-lock-loop circuits and, in particular, to a multiple phase-lock-loop circuit for recovering a clock signal from an input data signal.

2. Background of the Related Art

A signal detector for a digital communications channel, such as the read channel of a hard disk drive, is a circuit that generates a stream of recovered data and a recovered clock signal from an input data signal which is transmitted through the communications channel. Recently, as a step towards increasing the density of data transmitted through a digital communications channel, signal detectors have begun to utilize quasi-DSP (digital signal processing) techniques to produce both the stream of recovered data and the recovered clock signal.

Some DSP-based signal detector architectures utilize a phase-lock-loop (PLL) clock recovery circuit to generate the recovered clock signal. FIG. 1 shows a simplified block diagram of a conventional DSP-based PLL clock recovery circuit 10. As shown in FIG. 1, circuit 10 includes a voltage controlled oscillator (VCO) 12, a DSP 14, and a digital-to-analog converter (DAC) 16.

In operation, VCO 12 generates a recovered clock signal RCLK which has a phase and frequency that are a function of the magnitude of a phase error signal PE. DSP 14 uses the recovered clock signal RCLK to sample an input data signal $V_{IN}$ to produce the stream of recovered data SRD. Ambiguous samples are typically resolved by recognizing probabilistic data patterns within the stream of recovered data SRD.

To accurately recover data from the input data signal $V_{IN}$, the recovered clock signal RCLK should be "locked" onto the clock signal that was originally used to transmit the data through the communications channel. As is well-known, since the frequency of the original clock signal is used to define the individual bits within the input data signal $V_{IN}$, an extracted clock signal which approximates the original clock signal can be derrived from the individual bits of the sampled input data signal.

DSP 14 uses voltage level and sequence detection circuitry to generate timing data from the sampled input data signal which indicates the phase difference between the recovered clock signal RCLK and the extracted clock signal. The timing data is then utilized to generate a digital error word DEW which represents the phase difference.

DAC 16 converts the digital error word DEW to the phase error signal PE which, in turn, adjusts the VCO 12 to change the magnitude of the phase and frequency of the recovered clock signal RCLK. The net result is that the phase of the recovered clock signal RCLK is adjusted so as to reduce any phase and frequency difference between the clock signal embedded in the incoming data and the extracted clock signal.

One problem with utilizing DSP techniques in the read channel of a hard disk drive is that data is transmitted through the read channel at different frequencies as a result of the different frequencies used to fix the data on the hard disk drive. With disk drives, each track typically contains user data which has been recorded at one clock frequency and servo data which has been fixed at another clock frequency. In addition, groups of tracks, often called zones, are frequently recorded at different frequencies. Thus, the center frequency of the extracted clock signal will change each time the read head of the hard disk drive reads a different zone of data.

One technique for accommodating the changing center frequency of the extracted clock signal is to incorporate a multiplying DAC and bias the DAC with a variable input such that its bias point corresponds to the desired frequency of the extracted clock signal. With this technique, the center frequency of the recovered clock signal RCLK can be rapidly changed by simply changing the bias on the DAC.

Another problem with utilizing DSP techniques with a read channel is that the clock recovery circuit must be able to quickly lock the recovered clock signal onto each of the zone frequencies. As stated above, to accurately recover data from the input data signal $V_{IN}$, the recovered clock signal should be "locked" onto the clock signal originally used to transmit the data. Thus, to avoid excessive latency time each time the frequency of the extracted clock signal changes, the circuit must quickly lock the recovered clock signal onto the current clock frequency of the data signal.

One technique for quickly locking the frequency of the recovered clock signal onto each of the zone frequencies of the data is to incorporate a processor which "learns" the bias point which corresponds to the frequency of each type of data.

In a learning process, the processor typically sends a series of digital bias words to a DAC which drives the oscillator to produce the recovered clock signal with a corresponding series of different frequencies. The processor measures each of the frequencies and generates a "look-up" table which matches each digital bias word to a specific frequency.

FIG. 2 shows a simplified block diagram which illustrates a processor 18 connected to the PLL circuit 10 of FIG. 1. As shown in FIG. 2, processor 18 receives the recovered clock signal RCLK from VCO 12 and transmits a digital bias word DBW to DAC 16.

In operation, when data from a particular track or zone is to be read, processor 18 looks up the center frequency for that zone in the look-up table, and then generates the digital bias word DBW which corresponds to that center frequency. The digital bias word DBW then drives VCO 12 to produce the recovered clock signal at a center frequency which is close to the original center frequency.

DSP 14 then samples the input data signal $V_{IN}$ and produces digital error word DEW. DAC 16 combines the digital error word DEW and the digital bias word DBW to modify the phase error signal PE. Since the recovered clock signal is substantially identical to the original write-clock signal, the recovered clock signal is able to quickly lock onto the data clock frequency. When, for example, the data changes from user data to servo data, processor 18 simply looks up the center frequency of the servo data and generates a new digital bias word DBW.

The principal advantage obtained from using a learning process is that processor 18 can quickly drive VCO 12 to produce the recovered clock signal with a series of very precise center frequencies. The principal disadvantage of utilizing the learning process, however, is that the circuitry required to implement the learning process consumes a significant amount of die area, power, and processing time.

In addition, if the oscillator does not have low thermal (or other) drift characteristics, then the learning process must be periodically repeated to insure that the look-up table remains accurate. Thus, there is a need for a DSP-based PLL clock recovery circuit that can quickly lock the recovered clock signal onto an extracted clock signal which has a changing center frequency without utilizing a learning process.

SUMMARY OF THE INVENTION

The present invention provides a multiple phase-lock-loop (PLL) clock recovery circuit and method that generates a recovered clock signal which has a plurality of selectable center frequencies. The recovered clock signal generated by the PLL circuit can be quickly switched between different center frequencies by utilizing a synchronizing/decoding PLL with a phase detector, such as a DSP (digital signal processor), and by utilizing additional PLL circuitry to generate bias signals which can be switched into and out of the synchronizing/decoding PLL to change the center frequency of the recovered clock signal.

A multiple PLL circuit in accordance with the present invention includes a first biasing PLL that generates a first biasing signal which has a magnitude that is a function of the first frequency of an externally generated first clock signal. A second biasing PLL generates a second biasing signal which has a magnitude that is a function of the second frequency of an externally generated second clock signal. A multiplexor generates a selected bias signal by selecting either the first bias signal or the second biasing signal in response to an externally-generated select signal. A primary controlled oscillator generates the recovered clock signal in response to a phase error signal. The center frequency of the recovered clock signal is a function of the magnitude of the phase error signal. A multiplying digital-to-analog converter generates the phase error signal by modifying the selected bias signal from the multiplexor with an externally generated digital error word so that the magnitude of the phase error signal is principally determined by the magnitude of the selected bias signal. The phase error signal can be generated, for example, by multiplying the selected bias signal by the value of the digital error word.

In operation, the center frequency of the recovered clock signal is principally determined by the selected bias signal. In addition, the recovered clock signal can be locked onto timing data extracted from an input data signal by a digital signal processor that generates the digital error word in response to a phase difference between the recovered clock signal and the timing information in the data. The net result is that the phase of the recovered clock signal is adjusted so as to reduce any phase difference between the recovered clock signal and the data.

The first biasing PLL includes a first controlled oscillator that generates a first local clock signal in response to the first biasing signal. A first phase detector compares the phase of the first local clock signal to the phase of the externally generated first clock signal and generates the first biasing signal in response thereto.

In operation, the phase of the first local clock signal is adjusted so as to reduce any difference between the phase of the first local clock signal and the phase of the externally generated first clock signal. In addition, when the phase of the first local clock signal is substantially coincident with the phase of the externally generated first clock signal, the first biasing signal will drive the first controlled oscillator or a similar controlled oscillator to produce the first local clock signal at the first frequency.

Similarly, the second biasing PLL includes a second controlled oscillator that generates a second local clock signal in response to the second biasing signal. A second phase detector compares the phase of the second local clock signal to the phase of the externally generated second clock signal and generates the second biasing signal in response thereto.

As with the first PLL, the phase of second local clock signal is adjusted so as to reduce any difference between the phase of the second local clock signal and the phase of the externally generated second clock signal. In addition, when the phase of the second local clock signal is substantially coincident with the phase of the externally generated second clock signal, the second biasing signal will drive the second controlled oscillator or a similar controlled oscillator to produce the second local clock signal at the second frequency.

In the present invention, the primary controlled oscillator, the first controlled oscillator, and the second controlled oscillator are formed to be substantially identical. Further, the primary controlled oscillator, the first controlled oscillator, and the second controlled oscillator can be, for example, either current controlled oscillators or voltage controlled oscillators.

In accordance with a method for generating a recovered clock signal which has a plurality of selectable center frequencies, a first biasing signal is generated which has a magnitude that is a function of the first frequency of an externally generated first clock signal. A second biasing signal is generated which has a magnitude that is a function of the second frequency of an externally generated second clock signal. A selected bias signal is generated by selecting either the first bias signal or the second biasing signal in response to an externally-generated select signal and generating the recovered clock signal in response to a phase error signal. The center frequency of the recovered clock signal is a function of the magnitude of the phase error signal. The phase error signal is generated by modifying the selected bias signal with an externally generated digital error word so that the magnitude of the phase error signal is principally determined by the magnitude of the selected bias signal.

A better understanding of the features and advantages of the present invention will be obtained by reference to the following detailed description and accompanying drawings which set forth an illustrative embodiment in which the principles of the invention are utilized.

DETAILED DESCRIPTION

Figure 1:
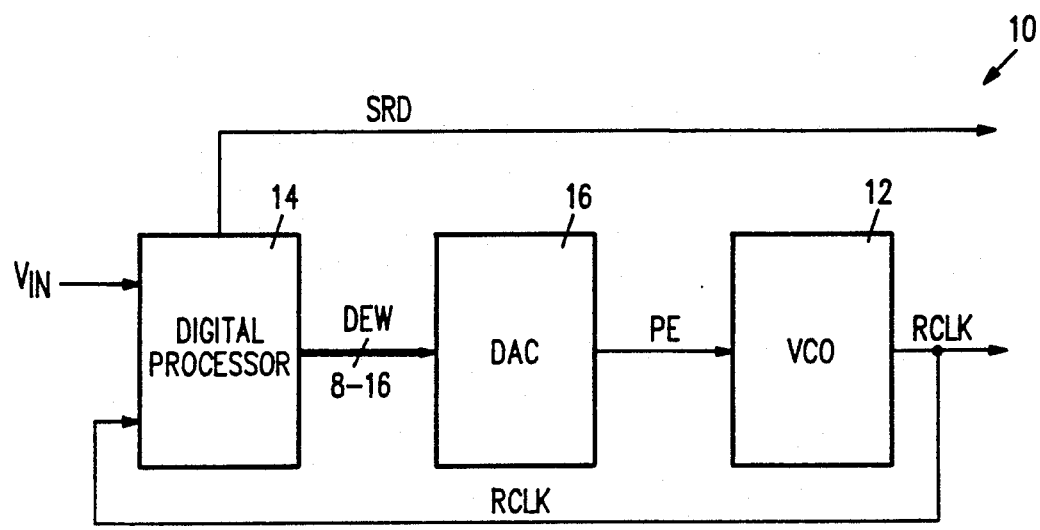
FIG. 1 is a simplified block diagram illustrating a conventional DSP-based PLL clock recovery circuit 10.
Figure 2:
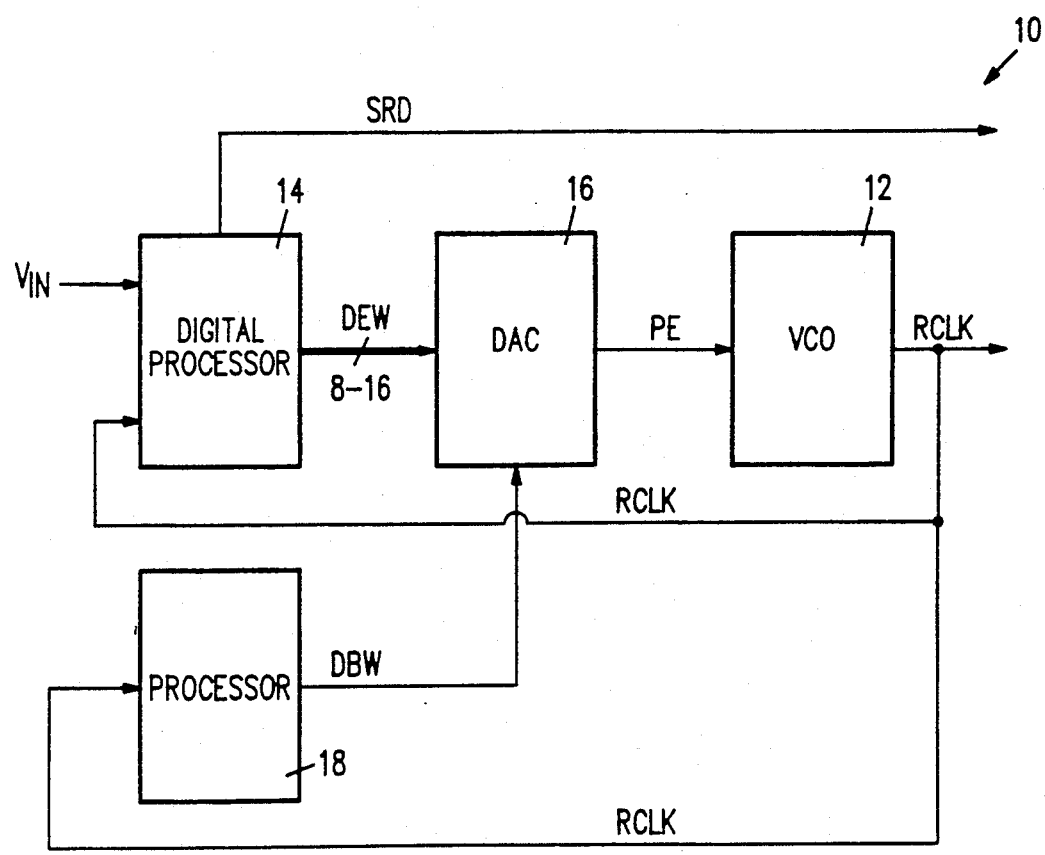
FIG. 2 is a simplified block diagram illustrating a processor 18 connected to the PLL clock recovery circuit 10 of FIG. 1.
Figure 3:
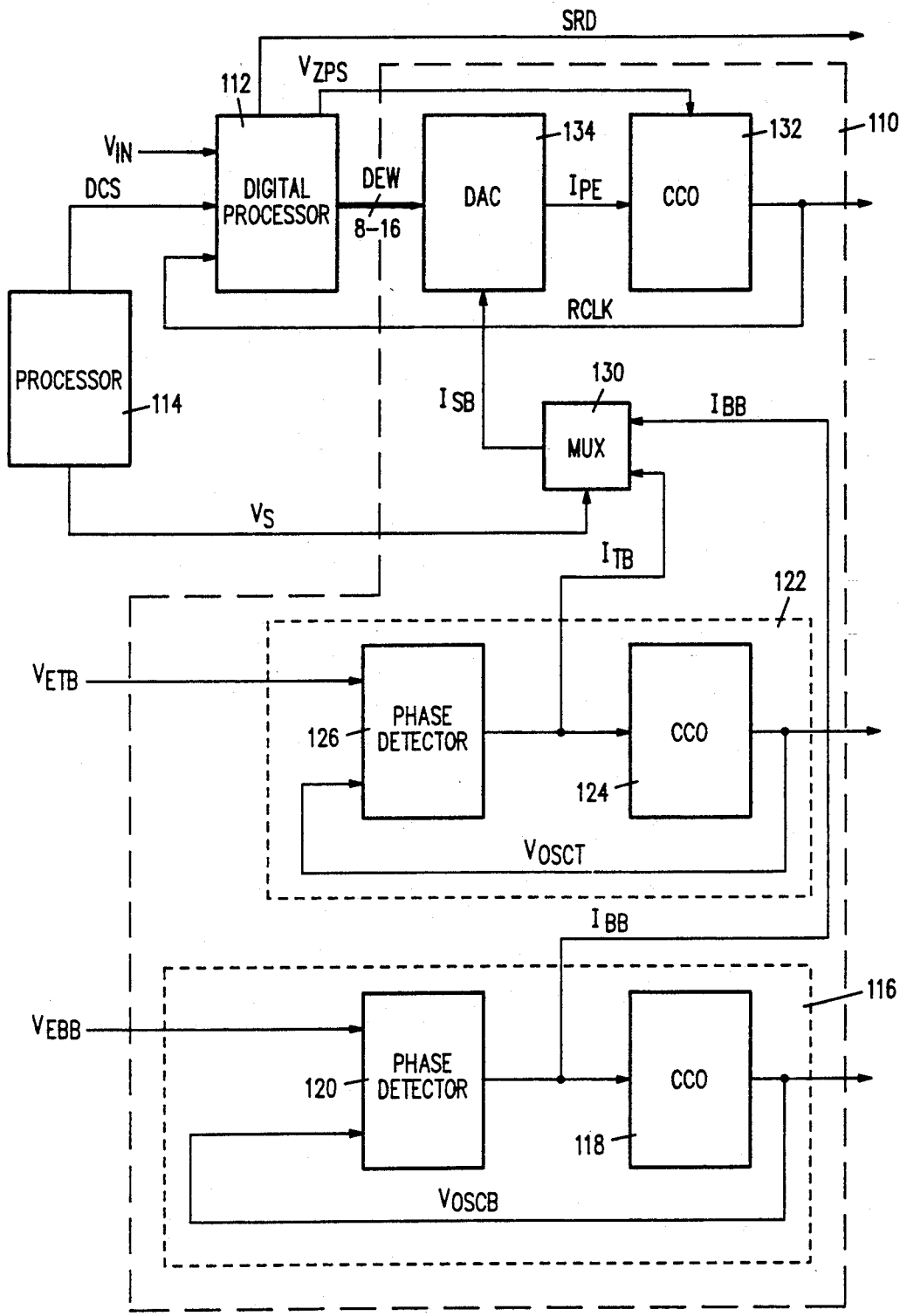
FIG. 3 is a block diagram illustrating multiple PLL (phase-lock-loop) clock recovery circuit 110, connected to a DSP (digital signal processor) 112 and a processor 114 in a hard disk drive configuration in accordance with the present invention.

FIG. 3 shows a block diagram of a multiple phase-lock-loop (PLL) clock recovery circuit 110, connected to a DSP (digital signal processor) 112 and a processor 114 in a hard disk drive configuration. As described above, when an input data signal alternates between servo data and user data which have been recorded on a hard disk drive at different center frequencies, the clock recovery circuit 110 must be able to locally generate a recovered clock signal that can quickly switch between the different center frequencies and lock onto the current center frequency so that the servo and user data carried by the input data signal can be accurately sampled.

As described in greater detail below, circuit 110 generates a recovered clock signal that can quickly switch between different center frequencies by forming a decoding PLL with a DSP (digital signal processor) and by utilizing additional PLL circuitry to generate bias signals which can be switched into and out from the decoding PLL to change the center frequency of the recovered clock signal.

As shown in FIG. 3, circuit 110 includes a servo biasing PLL 116 that generates a servo biasing current $I_{BB}$ which has a magnitude that is a function of the servo frequency of an externally generated servo clock signal $V_{EBB}$.

Servo biasing PLL 116 includes a current controlled oscillator (CCO) 118 that generates a local oscillator signal $V_{OSCB}$ in response to the servo biasing current $I_{BB}$, and a phase detector 120 that generates the servo biasing current $I_{BB}$ in response to the frequency and phase difference between the externally generated servo clock signal $V_{EBB}$ and the local oscillator signal $V_{OSCB}$.

In operation, the servo biasing current $I_{BB}$ directly controls the frequency and phase of the local oscillator signal $V_{OSCB}$. The net result is that the phase of the local oscillator signal $V_{OSCB}$ is adjusted so as to reduce any phase difference between the local oscillator signal $V_{OSCB}$ and the externally generated servo clock signal $V_{EBB}$. Thus, when the phase of the local oscillator signal $V_{OSCB}$ substantially coincides with the phase of the externally generated servo clock signal $V_{EBB}$, the magnitude of the servo biasing current $I_{BB}$ will have settled to a value which will drive CCO 118 or any substantially identical CCO to generate an oscillator signal at the servo frequency.

In the present invention, the servo frequency of the externally-generated servo clock signal $V_{EBB}$ is substantially equivalent to the center frequency of the clock signal that was originally used to form the servo data on the hard disk drive.

Circuit 110 additionally includes a zone biasing PLL 122 that generates a zone biasing current $I_{TB}$ which has a magnitude that is a function of the zone frequency of an externally generated zone clock signal $V_{ETB}$. Zone biasing PLL 122 includes a CCO 124 that generates a local oscillator signal $V_{OSCT}$ in response to the zone biasing current $I_{TB}$, and a phase detector 126 that generates the zone biasing current $I_{TB}$ in response to the phase difference between the externally generated zone clock signal $V_{ETB}$ and the local oscillator signal $V_{OSCT}$. In the preferred embodiment, CCO 124 is formed to be substantially identical to CCO 118.

As with servo biasing PLL 116, the externally-generated zone clock signal $VET_B$ has a frequency which is substantially equivalent to the center frequency of the clock signal that was originally used to record the zone data on the hard disk drive. In the preferred embodiment, the zone clock signal $V_{ETB}$ is the same clock signal that was originally used to record the zone data.

Similarly, in operation, the zone biasing current $I_{TB}$ causes the phase of the local oscillator signal $V_{OSCT}$ to change. The net result is that the phase of the local oscillator signal $V_{OSCT}$ is adjusted so as to reduce any phase difference between the local oscillator signal $V_{OSCT}$ and the externally generated zone clock signal $V_{ETB}$. Thus, when the phase of the local oscillator signal $V_{OSCT}$ is substantially coincident with the phase of the externally generated zone clock signal $V_{ETB}$, the magnitude of the zone biasing current $I_{TB}$ will have settled to a value which will drive CCO 124 or any substantially identical CCO to generate an oscillator signal at the zone frequency.

Circuit 110 further includes a multiplexor 130 that passes either the servo bias current $I_{BB}$ or the zone biasing current $I_{TB}$ as a selected bias current $I_{SB}$ in response to an externally-generated select signal $V_S$. Thus, the magnitude of the selected bias current $I_{SB}$ is changed by selecting either the servo bias current $I_{BB}$ or the zone biasing current $I_{TB}$. In the preferred embodiment, the externally-generated select signal $V_S$ is generated by processor 114.

As shown in FIG. 3, circuit 110 also includes a CCO 132 which generates a recovered clock signal RCLK in response to a DSP generated restart signal $V_{ZPS}$, which is utilized to achieve a zero phase restart, and a phase error current $I_{PE}$, and a multiplying digital-to-analog converter (DAC) 134 which generates the phase error current $I_{PE}$ in response to a digital error word DEW and the selected bias current $I_{SB}$. In the present invention, CCO 132 is formed to be substantially identical to both CCO 124 and CCO 118.

As further shown in FIG. 3, a decoding PLL is formed by connecting DSP 112 to both CCO 132 and DAC 134. As described in greater detail below, DSP 112 generates a stream of recovered data SRD, the digital error word DEW and the restart signal $V_{ZPS}$ in response to an input data signal $V_{IN}$, the recovered clock signal RCLK, and data transmitted across a digital control bus DCS.

In operation, prior to decoding data symbols or bits within the input data signal $V_{IN}$, DSP 112 is notified by processor 114 to expect to receive either servo data or user data via the digital control bus DCS. Processor 114 correspondingly selects either the servo biasing current $I_{BB}$ or the zone biasing current $I_{TB}$ via the select signal $V_S$. In response, DSP 112 initially sets the digital error word DEW to an equivalent DAC multiplying value at (or near) unity.

The frequency and phase of the recovered clock signal RCLK generated by CCO 132 is controlled by the magnitude of the phase error current $I_{PE}$. DAC 134 sets the magnitude of the phase error current $I_{PE}$ by multiplying the magnitude of the selected bias current $I_{SB}$ with the value represented by the digital error word DEW.

Since the initial value of the digital error word DEW is essentially unity, the magnitude of the phase error current $I_{PE}$ is defined by the magnitude of the selected bias current $I_{SB}$. Thus, since CCO 132 is formed to be substantially identical to CCO 118 and CCO 124, and since CCO 132 is initially biased by either the servo biasing current $I_{BB}$ or the zone biasing current $I_{TB}$, CCO 132 will immediately generate the recovered clock signal RCLK with a center frequency which is substantially identical to either the servo frequency or the zone frequency, respectively.

CCO 132 generates the recovered clock signal RCLK which has a phase and frequency that are a function of the magnitude of the phase error current $I_{PE}$. DSP 112 uses the recovered clock signal RCLK to sample the input data signal $V_{IN}$ to produce the stream of recovered data SRD. Ambiguous samples are typically resolved by recognizing probabilistic data patterns within the stream of recovered data SRD by utilizing techniques such as the partial response maximum likelihood method.

To accurately recover data from the input data signal $V_{IN}$, the recovered clock signal RCLK should be "locked" onto the clock signal that was originally used to record the data on the hard disk drive. As is well-known, the frequency of the original clock signal used to define or write the individual bits within the input data signal $V_{IN}$, which is also known as an embedded clock signal, can be extracted from the individual bits of the sampled input data signal and compared to the recovered clock signal RCLK.

As DSP 112 receives the input data signal $V_{IN}$ at the beginning of a read operation instructed by processor 114, DSP 112 stops and restarts the oscillation of CCO 132 via the restart signal $V_{ZPR}$ so that the starting phase of the recovered clock signal RCLK will be generated substantially coincident with the phase of the embedded clock signal.

DSP 112 uses voltage level and sequence detection circuitry to extract timing data from the sampled input data signal $V_{IN}$ which indicates the phase difference between the recovered clock signal RCLK and the embedded clock signal. The timing data is then utilized to generate the digital error word DEW which represents the phase difference.

Since the frequency and phase of the recovered clock signal RCLK is substantially identical to the frequency and phase of the original clock signal, the value of the digital error word DEW will reflect only a minor fractional increase or decrease over the initial value of unity, thereby allowing the recovered clock signal RCLK to track and remain locked onto the embedded clock signal. Thus, the center frequency of the recovered clock signal is principally determined by the externally generated select signal $V_S$.

When, for example, the data changes from zone data to servo data, processor 114 simply notifies DSP 112 of the switch and changes the select signal $V_S$ so that the selected biasing current $I_{SB}$ reflects the servo biasing current $I_{BB}$ rather than the zone biasing current $I_{TB}$.

DSP 112, processor 114, CCO 132, DAC 116, PLL 116, and PLL 122 can be implemented with conventional circuitry. In the preferred embodiment, DSP 112 is implemented with a CL-SH3300 DSP manufactured by Crystal Semiconductor Corporation.

As stated above, since CCO 132 is formed to be substantially identical to CCO 118 and CCO 124, and since CCO 132 is initially biased by either the servo biasing current $I_{BB}$ or the zone biasing current $I_{TB}$, CCO 132 will immediately generate the recovered clock signal RCLK with a center frequency which is substantially identical to either the servo frequency or the recorded data frequency, respectively.

However, due to process limitations and other factors, it is unlikely that the resulting center frequency of the recovered clock signal RCLK will be precisely identical to either the servo frequency or the zone frequency. Thus, in a first alternative embodiment, DAC 134 can be sent an appropriate offset value in the digital error word to compensate for the differences between CCO 132, CCO 118, and CCO 124.

In the first alternative embodiment, the offset value can be formed by utilizing a modified learning process. Since the servo biasing current $I_{BB}$ and the zone biasing current $I_{TB}$ drive CCO 132 to produce the recovered clock signal RCLK at a center frequency which is substantially equivalent to the servo frequency or the zone frequency, respectively, only a limited number of offset values need to be generated to precisely control the resultant bias currents.

In the learning mode, processor 114 "remembers" and stores the actual final value of the digital error word DEW after stable lock has been achieved for each data zone and for the servo region. Then, at the beginning of subsequent data or servo read operations, processor 114 instructs DSP 112 to issue the appropriate stored error word DEW for the corresponding frequency, either servo or any of the data zones, at the very outset of the lock sequence. In this way, local oscillator CCO 132 has a starting frequency which is very close to the desired final locked value and very little additional frequency adjustment is necessary to achieve lock. This, in conjunction with the zero phase start function, causes both the phase and frequency of CCO 132 to be very nearly in complete lock at the beginning of the read operation, thereby bringing loop lock time to an absolute minimum.

As stated above, when data is recorded on a hard disk drive in zones, the data in each zone is recorded with a different clock frequency. One method for producing a bias current which corresponds with each data frequency in a zoned application is to use a multi-input multiplexer and multiple phase-lock-loops where each phase-lock-loop generates one of the required bias currents. Another method for producing multiple bias currents is by using a frequency synthesizer in place of PLL 122.

Figure 4:
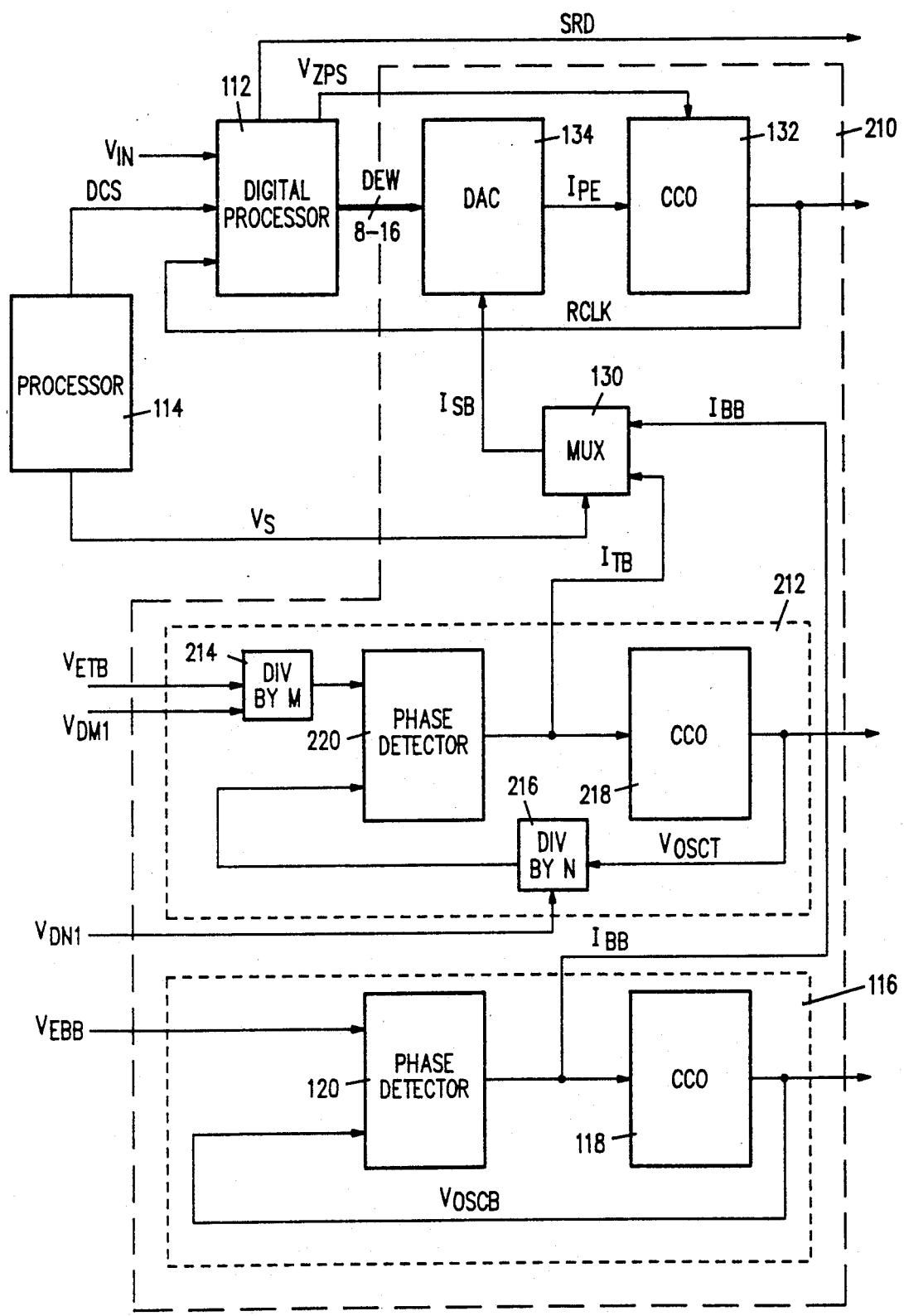
FIG. 4 is a block diagram illustrating a multiple phase-lock-loop clock recovery circuit 210 which illustrates the use of a frequency synthesizer 212 in place of PLL 122.

FIG. 4 shows a block diagram of a multiple phase-lock-loop 210 which illustrates the use of a frequency synthesizer 212 in place of PLL 122. As shown in FIG. 4, frequency synthesizer 212 includes a divide-by-M circuit 214, a divide-by-N circuit 216, a CCO 218, and a phase detector 220.

In operation, frequency synthesizer 212, which is well-known in the art, can generate a local clock signal with one of a series of different frequencies by altering either or both of the divide-by-M or divide-by-N circuits 214 and 216 in response to a divide-by-M control signal $V_{DM1}$ and a divide-by-N control signal $VD_{DN1}$, respectively.

For example, if the externally generated zone clock signal $V_{ETB}$ has a frequency of 8 MHz, the frequency presented at the input to phase detector 220 can be varied by varying the divide-by-M circuit. If the divide-by-M circuit is set to 2, then a 4 MHz signal will be input to phase detector 220. The operation of the loop will also force the local oscillator signal $V_{OSCT}$ present at the input of phase detector 220 to 4 MHz. If the divide-by-N circuit is set to 4, then the frequency of the local oscillator signal $V_{OSCT}$ generated by CCO 218 will be 16 MHz.

Figure 5:
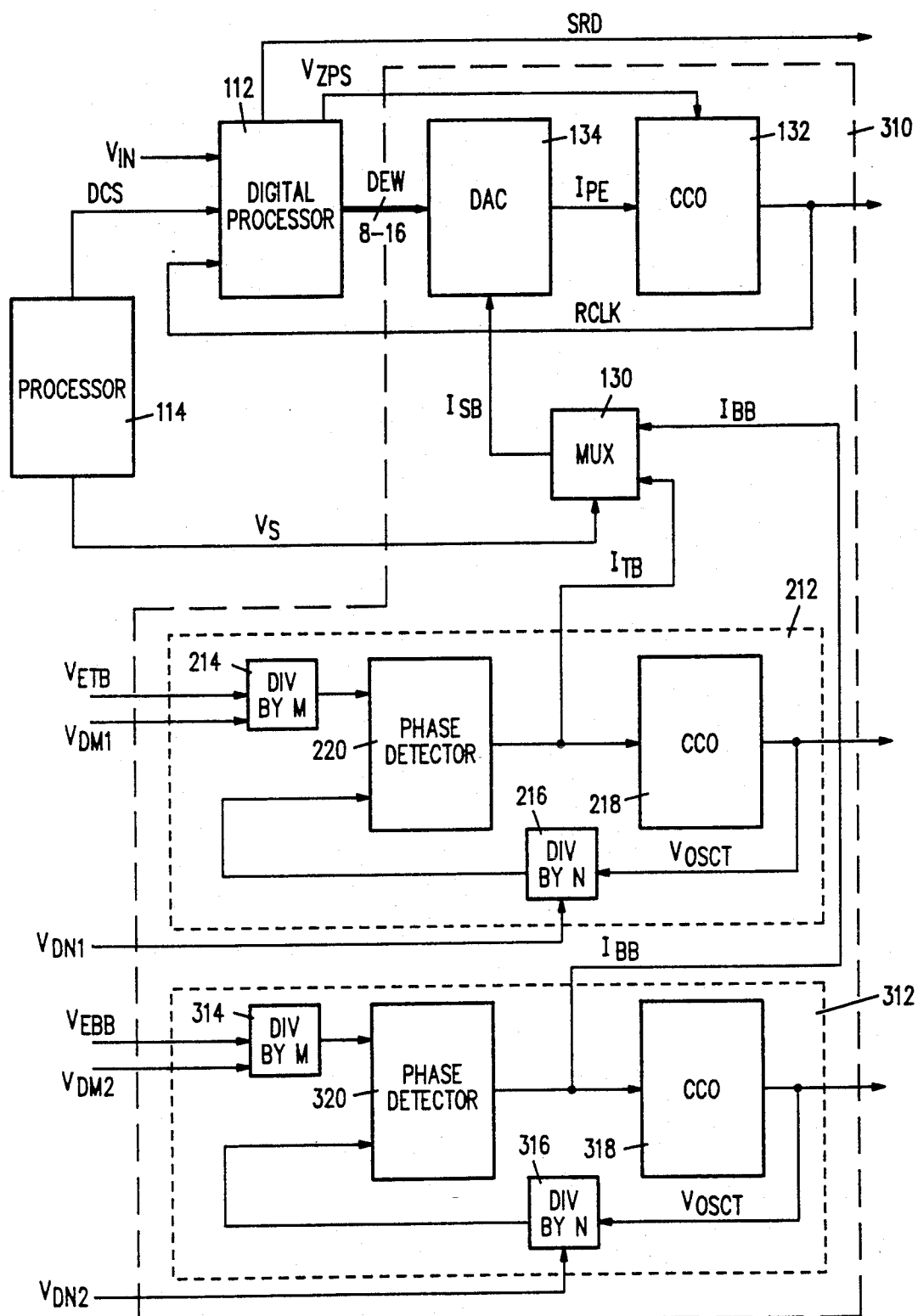
FIG. 5 is a block diagram of a multiple phase-lock-loop 310 illustrating the use of a frequency synthesizer 310 in lieu of PLL 116.

In addition, a frequency synthesizer can also be utilized in lieu of servo biasing PLL 116. FIG. 5 shows a block diagram of a multiple phase-lock-loop 310 which illustrates the use of a frequency synthesizer 312 in lieu of PLL 116. As shown in FIG. 5, frequency synthesizer 312 includes a divide-by-M circuit 314, a divide-by-N circuit 316, a CCO 318, and a phase detector 320, each of which operate in the same manner as the corresponding elements of frequency synthesizer 212.

It should be understood that various alternatives to the structures described herein may be employed in practicing the present invention. For example, a voltage controlled oscillator can be used in lieu of a current controlled oscillator. In addition, the present invention can be used with clock recovery circuits which utilize traditional phase and frequency detectors as well as DSP-based detectors.

Further, the scope of the present invention is not intended to be limited to hard disk drive applications. The present invention is equally applicable, for example, to a signal detector used with other digital communication channels. It is intended that the following claims define the invention and that structures and methods within the scope of these claims and their equivalents be covered thereby.

What is claimed is:

1. A recovered clock circuit for generating a recovered clock signal having a plurality of selectable center frequencies, the recovered clock circuit being connectable with a digital signal processor (DSP) to form a phase-lock-loop (PLL), the DSP generating a digital error word in response to a phase difference between the recovered clock signal and timing data extracted by the DSP from an input data signal, the recovered clock circuit comprising:

first biasing PLL means for generating a first biasing signal having a magnitude that is a function of the frequency of a first clock signal;

second biasing PLL means for generating a second biasing signal having a magnitude that is a function of the frequency of a second clock signal;

multiplexor means for passing either the first biasing signal or the second biasing signal as a selected bias signal in response to a select signal;

primary controlled oscillator means for generating the recovered clock signal in response to a phase error signal, the center frequency of the recovered clock signal being a function of the magnitude of the phase error signal; and multiplying digital-to-analog converter means for generating the phase error signal by modifying the selected bias signal with the digital error word;

whereby the center frequency of the recovered clock signal is principally determined by the selected bias signal, and whereby the phase of the recovered clock signal is adjusted so as to reduce any phase difference between the recovered clock signal and the timing data.

2. The circuit of claim 1 wherein the first biasing PLL means comprises:

first controlled oscillator means for generating a first local clock signal in response to the first biasing signal;

first phase detector means for comparing the phase of the first local clock signal to the phase of the first clock signal and for generating the first biasing signal in response thereto;

whereby the phase of first local clock signal is adjusted by the first biasing signal so as to reduce any phase difference between the phase of the first local clock signal and the phase of the first clock signal, and whereby when the phase of the first local clock signal is substantially coincident with the phase of the first clock signal, the first biasing signal will drive the first controlled oscillator or a substantially identical controlled oscillator to produce the first local clock signal with a frequency that is substantially identical to the frequency of the first clock signal.

3. The circuit of claim 2 wherein the second biasing PLL means comprises:

second controlled oscillator means for generating a second local clock signal in response to the second biasing signal;

second phase detector means for comparing the phase of the second local clock signal to the phase of the second clock signal and for generating the second biasing signal in response thereto;

whereby the phase of second local clock signal is adjusted by the second biasing signal so as to reduce any phase different between the phase of the second local clock signal and the phase of the second clock signal, and whereby when the phase of the second local clock signal is substantially coincident with the phase of the second clock signal, the second biasing signal will drive the second controlled oscillator or a substantially identical controlled oscillator to produce the second local clock signal with a frequency that is substantially identical to the frequency of the second clock signal.

4. The circuit of claim 3 wherein the primary controlled oscillator means, the first controlled oscillator means, and the second controlled oscillator means are formed to be substantially identical.

5. The circuit of claim 4 wherein the primary controlled oscillator means, the first controlled oscillator means, and the second controlled oscillator means are current controlled oscillators.

6. The circuit of claim 4 wherein the primary controlled oscillator means, the first controlled oscillator means, and the second controlled oscillator means are voltage controlled oscillators.

7. The circuit of claim 2 wherein the second biasing PLL means comprises:

second controlled oscillator means for generating a second local clock signal in response to the second biasing signal;

divide-by-N means for dividing the frequency of the second local clock signal to produce a divided second local clock signal in response to a divide-by-N signal;

divide-by-M means for dividing the frequency of the second clock signal to produce a divided second clock signal in response to a divide-by-M signal;

second phase detector means for comparing the phase of the divided second local clock signal to the phase of the divided second clock signal and for generating the second biasing signal in response thereto;

whereby the phase of second local clock signal is adjusted by the second biasing signal so as to reduce any phase difference between the phase of the divided second local clock signal and the phase of the divided second clock signal, and whereby when the phase of the divided second local clock signal is substantially coincident with the phase of the divided second clock signal, the second biasing signal will drive the second controlled oscillator means or a substantially identical controlled oscillator to produce the second local clock signal at a synthesized frequency defined by the values of the divided second local clock signal and the divided second clock signal.

8. The circuit of claim 2 wherein the second biasing PLL means generates a plurality of second biasing signals in response to a corresponding plurality of second clock signals.

9. The circuit of claim 1 wherein the phase error signal is generated by multiplying the selected bias signal by the value of the digital error word.

10. The circuit of claim 1 wherein the value of the digital error word includes an offset value.

11. The circuit of claim 1 wherein the primary controlled oscillator means generates the recovered clock signal in response to both the phase error signal and a DSP generated restart signal.

12. A method for generating a recovered clock signal having a plurality of selectable center frequencies that are phase aligned with timing data that has been extracted by a digital signal processor from an input data signal, the method comprising the steps of:

generating a first biasing signal having a magnitude that is a function of the frequency of a first clock signal;

generating a second biasing signal having a magnitude that is a function of the frequency of a second clock signal;

selecting either the first biasing signal or the second biasing signal as a selected bias signal in response to a select signal;

generating the recovered clock signal in response to a phase error signal, the center frequency of the recovered clock signal being a function of the magnitude of the phase error signal; and generating the phase error signal by modifying the selected bias signal with a digital error word generated by the digital signal processor, the digital error word representing a phase difference between the recovered clock signal and the timing data;

whereby the center frequency of the recovered clock signal is principally determined by the selected bias signal, and whereby the phase of the recovered clock signal is adjusted so as to reduce any phase difference between the recovered clock signal and the timing data.

13. A recovered clock circuit for generating a recovered clock signal having a plurality of selectable center frequencies, the recovered clock circuit being connectable with a digital signal processor (DSP) to form a phase-lock-loop (PLL), the DSP generating a digital error word in response to a phase difference between the recovered clock signal and timing data extracted by the DSP from an input data signal, the recovered clock circuit comprising:

a first biasing PLL that generates a first biasing signal having a magnitude that is a function of the frequency of a first clock signal;

a second biasing PLL that generates a second biasing signal having a magnitude that is a function of the second frequency of a second clock signal;

a multiplexor that passes either the first biasing signal or the second biasing signal as a selected bias signal in response to a select signal;

a primary controlled oscillator that generates the recovered clock signal in response to a DSP generated restart signal and a phase error signal, the center frequency of the recovered clock signal being a function of the magnitude of the phase error signal; and a digital-to-analog converter that generates the phase error signal by modifying the selected bias signal with the digital error word;

whereby the center frequency of the recovered clock signal is principally determined by the selected bias signal, and whereby the phase of the recovered clock signal is adjusted so as to reduce any phase difference between the recovered clock signal and the timing data.

14. The circuit of claim 13 wherein the first biasing PLL comprises:

a first controlled oscillator that generates a first local clock signal in response to the first biasing signal;

a first phase detector that compares the phase of the first local clock signal to the phase of the first clock signal and that generates the first biasing signal in response thereto;

whereby the phase of first local clock signal is adjusted by the first biasing signal so as to reduce any phase difference between the phase of the first local clock signal and the phase of the first clock signal, and whereby when the phase of the first local clock signal is substantially coincident with the phase of the first clock signal, the first biasing signal will drive the first controlled oscillator or a substantially identical controlled oscillator to produce the first local clock signal with a frequency that is substantially identical to the frequency of the first clock signal.

15. The circuit of claim 14 wherein the second biasing PLL comprises:

a second controlled oscillator that generates a second local clock signal in response to the second biasing signal;

a second phase detector that compares the phase of the second local clock signal to the phase of the second clock signal and that generates the second biasing signal in response thereto;

whereby the phase of second local clock signal is adjusted by the second biasing signal so as to reduce any phase difference between the phase of the second local clock signal and the phase of the second clock signal, and whereby when the phase of the second local clock signal is substantially coincident with the phase of the second clock signal, the second biasing signal will drive the second controlled oscillator or a substantially identical controlled oscillator to produce the second local clock signal with a frequency that is substantially identical to the frequency of the second clock signal.

16. The circuit of claim 15 wherein the primary controlled oscillator, the first controlled oscillator, and the second controlled oscillator are formed to be substantially identical.

17. The circuit of claim 16 wherein the primary controlled oscillator, the first controlled oscillator, and the second controlled oscillator are current controlled oscillators.

18. The circuit of claim 16 wherein the primary controlled oscillator, the first controlled oscillator, and the second controlled oscillator are voltage controlled oscillators.

19. The circuit of claim 14 wherein the second biasing PLL comprises:
 a second controlled oscillator that generates a second local clock signal in response to the second biasing signal;
 a divide-by-N circuit that divides the frequency of the second local clock signal to produce a divided second local clock signal in response to a divide-by-N signal;
 a divide-by-M circuit that divides the frequency of the second clock signal to produce a divided second clock signal in response to a divide-by-M signal;
 a second phase detector that compares the phase of the divided second local clock signal to the phase of the divided second clock signal and that generates the second biasing signal in response thereto;
 whereby the phase of second local clock signal is adjusted by the second biasing signal so as to reduce any phase difference between the phase of the divided second local clock signal and the phase of the divided second clock signal, and
 whereby when the phase of the divided second local clock signal is substantially coincident with the phase of the divided second clock signal, the second biasing signal will drive the second controlled oscillator or a substantially identical controlled oscillator to produce the second local clock signal at a synthesized frequency defined by the values of the divided second local clock signal and the divided second clock signal.

20. The circuit of claim 14 wherein the second biasing PLL generates a plurality of second biasing signals in response to a corresponding plurality of second clock signals.

21. The circuit of claim 13 wherein the phase error signal is generated by modifying the selected bias signal by the value of the digital error word.

22. The circuit of claim 13 wherein the value of the digital error word includes an offset value.

23. The circuit of claim 13 wherein the first biasing PLL comprises:
 a first controlled oscillator that generates a first local clock signal in response to the first biasing signal;
 a divide-by-N circuit that divides the frequency of the first local clock signal to produce a divided first local clock signal in response to a divide-by-N signal;
 a divide-by-M circuit that divides the frequency of the first clock signal to produce a divided first clock signal in response to a divide-by-M signal;
 a first phase detector that compares the phase of the divided first local clock signal to the phase of the divided first clock signal and that generates the first biasing signal in response thereto;
 whereby the phase of first local clock signal is adjusted by the first biasing signal so as to reduce any phase difference between the phase of the divided first local clock signal and the phase of the divided first clock signal, and
 whereby when the phase of the divided first local clock signal is substantially coincident with the phase of the divided first clock signal, the first biasing signal will drive the first controlled oscillator or a substantially identical controlled oscillator to produce the first local clock signal at a synthesized frequency defined by the values of the divided first local clock signal and the divided first clock signal.

* * * * *

UNITED STATES PATENT AND TRADEMARK OFFICE
CERTIFICATE OF CORRECTION

PATENT NO. : 5,329,251
DATED : July 12, 1994
INVENTOR(S) : William D. Llewellyn

It is certified that error appears in the above-identified patent and that said Letters Patent is hereby corrected as shown below:

In col. 9, line 40, replace "recovered clock circuit" with --clock signal recovery circuit--;

In col. 9, line 43, replace "recovered clock circuit" with --clock signal recovery circuit--.

In col. 10, line 39, replace "different" with --difference--.

In col. 11, insert the following new paragraph immediately after the paragraph ending with "comprising the steps of:", which should begin on line 43: --providing a first clock signal, a second clock signal, a select signal, and a digital error word;--

In col. 11, line 44, replace "a first" with --the first--;

In col. 11, line 47, replace "a second" with --the second--;

In col. 11, line 51, replace "a select" with --the select--;

In col. 11, line 57, replace "a digital" with --the digital--;

In col. 11, lines 57-58, delete the phrase "generated by the digital signal processor".

UNITED STATES PATENT AND TRADEMARK OFFICE
CERTIFICATE OF CORRECTION

PATENT NO. : 5,329,251
DATED : July 12, 1994
INVENTOR(S) : William D. Llewellyn

It is certified that error appears in the above-identified patent and that said Letters Patent is hereby corrected as shown below:

In col. 12, line 1, replace "recovered clock circuit" with --clock signal recovery circuit--;

In col. 12, line 3, replace "recovered clock circuit" with --clock signal recovery circuit--.

Signed and Sealed this

Twenty-ninth Day of August, 1995

Attest:

BRUCE LEHMAN

Attesting Officer        Commissioner of Patents and Trademarks